(12) United States Patent
Carl et al.

(10) Patent No.: US 10,551,459 B2
(45) Date of Patent: Feb. 4, 2020

(54) SYSTEM AND METHOD FOR PERFORMING T2 MAGNETIC RESONANCE IMAGING OF AN OBJECT WITH FAT SUPPRESSION

(71) Applicants: GENERAL ELECTRIC COMPANY, Schenectady, NY (US); THE REGENTS OF THE UNIVERSITY OF CALIFORNIA, Oakland, CA (US)

(72) Inventors: Michael Carl, San Diego, CA (US); Jiang Du, San Diego, CA (US)

(73) Assignees: GENERAL ELECTRIC COMPANY, Schenectady, NY (US); THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 482 days.

(21) Appl. No.: 15/481,837

(22) Filed: Apr. 7, 2017

(65) Prior Publication Data

US 2018/0292490 A1  Oct. 11, 2018

(51) Int. Cl.
*G01R 33/50* (2006.01)
*G01R 33/56* (2006.01)

(52) U.S. Cl.
CPC ......... *G01R 33/50* (2013.01); *G01R 33/5607* (2013.01)

(58) Field of Classification Search
USPC .................. 324/300–322; 600/407–435; 382/128–131
See application file for complete search history.

(56) References Cited

U.S. PATENT DOCUMENTS

| 4,791,369 A * | 12/1988 | Yamamoto | G01R 33/24 324/308 |
| 2008/0077006 A1* | 3/2008 | Katscher | G01R 33/50 600/414 |

OTHER PUBLICATIONS

H.Shao, et al. Osteoarthritis and Cartilage; UTE bi-component analysis of T2 relaxation in articular cartilage; Osteoarthritis Research Society International; 2015; pp. 364-373.

* cited by examiner

*Primary Examiner* — Patrick Assouad
*Assistant Examiner* — Robert P Alejnikov, Jr.
(74) *Attorney, Agent, or Firm* — Grogan, Tuccillo & Vanderleeden, LLP (57) ABSTRACT

A method for performing magnetic resonance imaging of an object is provided. The method includes acquiring MR signals from the object via an MRI system, and generating correct T2 values and incorrect spin densities by applying a fitting model to the MR signals. The method further includes generating one or more correction factors, and generating corrected spin densities based at least in part on the incorrect spin densities and the one or more correction factors. The one or more correction factors are based at least in part on the correct T2 values and a bandwidth of a fat suppression signal applied to the object.

20 Claims, 4 Drawing Sheets

SYSTEM AND METHOD FOR PERFORMING T2 MAGNETIC RESONANCE IMAGING OF AN OBJECT WITH FAT SUPPRESSION

BACKGROUND

Technical Field

Embodiments of the present invention relate generally to magnetic resonance imaging ("MRI") systems, and more specifically, to a system and method for performing T2 magnetic resonance imaging of an object with fat suppression.

Discussion of Art

MRI is a widely accepted and commercially available technique for obtaining digitized visual images representing the internal structure of objects having substantial populations of atomic nuclei that are susceptible to nuclear magnetic resonance ("NMR"). Many MRI systems use superconductive magnets to scan a subject/patient via imposing a strong main magnetic field on the nuclei in the subject to be imaged. The nuclei are excited by a radio frequency ("RF") signal/pulse transmitted by a RF coil at characteristics NMR (Larmor) frequencies. By spatially disturbing localized magnetic fields surrounding the subject and analyzing the resulting RF responses from the nuclei as the excited protons relax back to their lower energy normal state, a map or image of these nuclei responses as a function of their spatial location is generated and displayed. An image of the nuclei responses provides a non-invasive view of a subject's internal structure.

The transverse relaxation property ("T2"), and/or the corresponding observed transverse relaxation property ("T2*"), of MR signals plays an important role in the assessment of pathology. For example, analysis/fitting of T2 MR signals provides for the ability to measures changes in the spin density ratios of two or more tissue types, also known as "pool fractions", within a region of interest of a patient/subject. Changes in pool fractions may provide for the early detection of a pathological condition.

Many musculoskeletal ("MSK") tissues, e.g., cortical bone, tendon, and ligaments, etc., have very short T2 relaxation times, which in turn requires specialized MR acquisition sequences/scans for optimal MR signal acquisition and quantification. One example of a specialized MR acquisition sequence for measuring short T2 times is the Ultrashort echo time ("TE") sequence ("UTE"), which provides for the assessment of T2s of tissues utilizing multi-echo MR acquisitions. Generally, UTE can be performed with or without fat suppression/saturation ("FS"), which involves suppressing the MR signals of fat tissues via transmitting a preparation RF pulse, also referred to hereinafter as a "FS pulse" and/or "FS signal", into the tissues. While FS pulses typically do not overlap significantly with the MR signal peaks of tissues having relatively long T2 times, e.g., soft tissues such as muscle fibers, FS pulses usually have significant overlap with the MR signal peaks of tissues having relatively short T2 times. The overlap of FS pulses with the MR signal peaks of tissues having short T2 times often results in measureable reductions in the MR signals of such tissues, which in turn makes measuring changes in the pool fractions of such tissues difficult.

What is needed, therefore, is an improved system and method for performing T2 magnetic resonance imaging of an object with fat suppression.

BRIEF DESCRIPTION

In an embodiment, a method for performing T2 magnetic resonance imaging of an object with fat suppression is provided. The method includes acquiring MR signals from the object via an MRI system, and generating correct T2 values and incorrect spin densities by applying a fitting model to the MR signals. The method further includes generating one or more correction factors, and generating corrected spin densities based at least in part on the incorrect spin densities and the one or more correction factors. The one or more correction factors are based at least in part on the correct T2 values and a bandwidth of a fat suppression signal applied to the object.

In another embodiment, an MRI system for performing T2 magnetic resonance imaging of an object with fat suppression is provided. The MRI system includes an MRI controller in electronic communication with a magnet assembly. The MRI controller is operative to acquire MR signals from the object via the magnet assembly, and to generate correct T2 values and incorrect spin densities by applying a fitting model to the MR signals. The MRI controller is further operative to generate one or more correction factors, and to generate corrected spin densities based at least in part on the incorrect spin densities and the one or more correction factors. The one or more correction factors are based at least in part on the correct T2 values and a bandwidth of a fat suppression signal applied to the object by the magnet assembly.

In yet another embodiment, a non-transitory computer readable medium storing instructions is provided. The stored instructions are configured to adapt an MRI controller to acquire MR signals from the object via an MRI system, and to generate correct T2 values and incorrect spin densities via applying a fitting model to the MR signals. The stored instructions further adapt the MRI controller to generate one or more correction factors, and to generate corrected spin densities based at least in part on the incorrect spin densities and the one or more correction factors. The one or more correction factors are based at least in part on the correct T2 values and a bandwidth of a fat suppression signal applied to the object.

DRAWINGS

The present invention will be better understood from reading the following description of non-limiting embodiments, with reference to the attached drawings, wherein below.

DETAILED DESCRIPTION

Reference will be made below in detail to exemplary embodiments of the invention, examples of which are illustrated in the accompanying drawings. Wherever possible, the same reference characters used throughout the drawings refer to the same or like parts, without duplicative description.

As used herein, the terms "substantially," "generally," and "about" indicate conditions within reasonably achievable manufacturing and assembly tolerances, relative to ideal desired conditions suitable for achieving the functional purpose of a component or assembly. As used herein, "electrically coupled," "electrically connected," and "electrical communication" mean that the referenced elements are directly or indirectly connected such that an electrical current may flow from one to the other. The connection may include a direct conductive connection, i.e., without an intervening capacitive, inductive or active element, an inductive connection, a capacitive connection, and/or any other suitable electrical connection. Intervening components may be present. Additionally, the terms "correct" and "corrected," as used herein with respect to spin densities, refer to spin densities that have been adjusted to compensate for attenuation based on a FS signal applied to an object that emitted the MR signals used to calculate the spin densities. The term "incorrect," as used herein with respect to spin densities, refers to spin densities that have not been adjusted to compensate for attenuation based on a FS signal applied to an object that emitted the MR signals used to calculate the spin densities. The term "correct" as used herein with respect to T2 and/or T2 values, refers to T2 and/or T2*.

Further, while the embodiments disclosed herein are described with respect to an MRI system, it is to be understood that embodiments of the present invention may be applicable to other imaging systems which utilize overlapping waves to suppress information. Further still, as will be appreciated, embodiments of the present invention related imaging systems may be used to analyze tissue generally and are not limited to human tissue.

Figure 1:
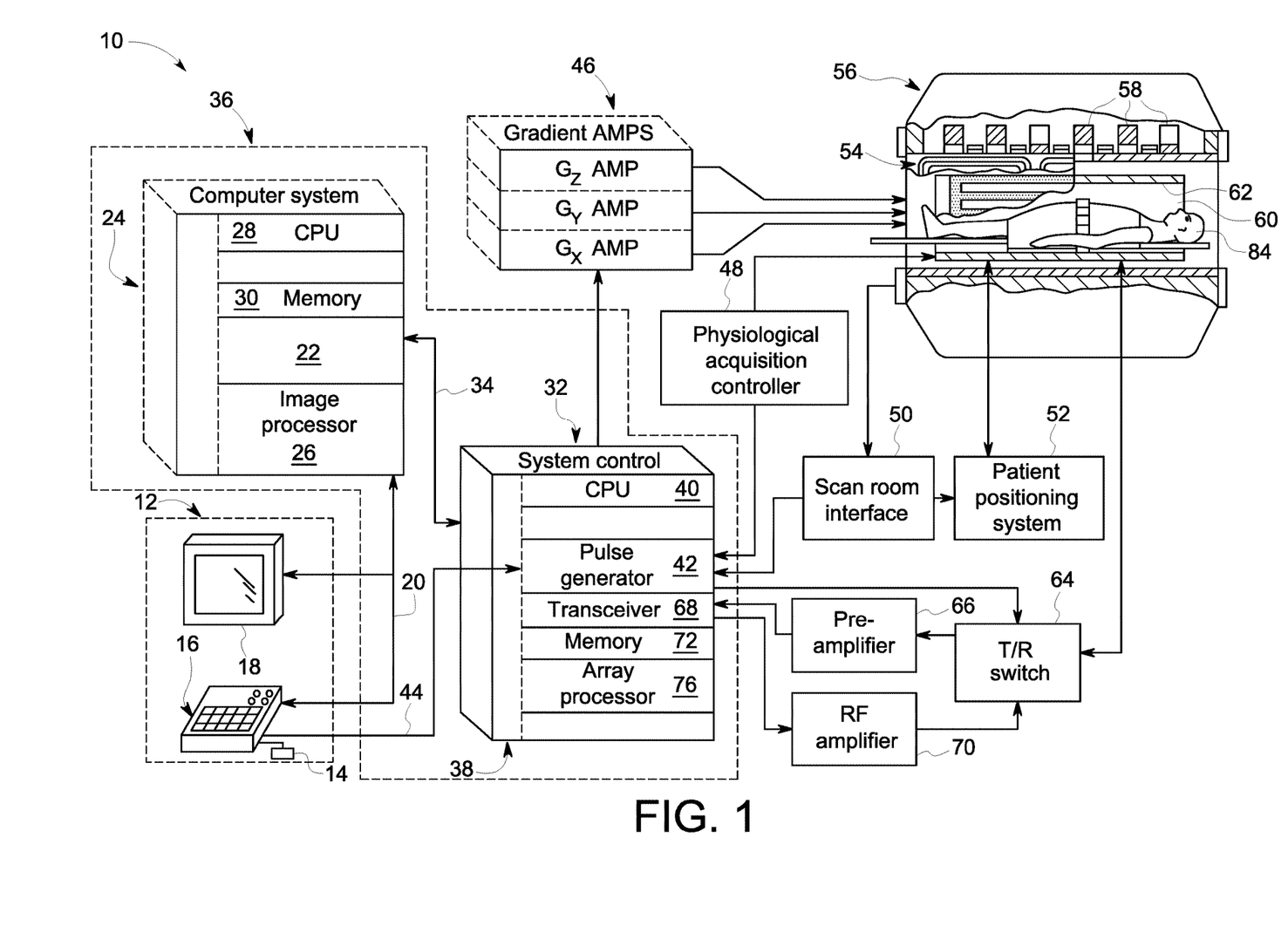
FIG. 1 is a block diagram of an exemplary MRI system for performing T2 magnetic resonance imaging of an object with fat suppression, in accordance with an embodiment of the present invention.

Referring now to FIG. 1, the major components of an MRI system 10 incorporating an embodiment of the invention are shown. Operation of the system 10 is controlled from the operator console 12, which includes a keyboard or other input device 14, a control panel 16, and a display screen 18. The console 12 communicates through a link 20 with a separate computer system 22 that enables an operator to control the production and display of images on the display screen 18. The computer system 22 includes a number of modules, which communicate with each other through a backplane 24. These include an image processor module 26, a CPU module 28 and a memory module 30, which may include a frame buffer for storing image data arrays. The computer system 22 communicates with a separate system control or control unit 32 through a high-speed serial link 34. The input device 14 can include a mouse, joystick, keyboard, track ball, touch activated screen, light wand, voice control, or any similar or equivalent input device, and may be used for interactive geometry prescription. The computer system 22 and the MRI system control 32 collectively form an "MRI controller" 36.

The MRI system control 32 includes a set of modules connected together by a backplane 38. These include a CPU module 40 and a pulse generator module 42, which connects to the operator console 12 through a serial link 44. It is through link 44 that the system control 32 receives commands from the operator to indicate the scan sequence that is to be performed. The pulse generator module 42 operates the system components to execute the desired scan sequence and produces data which indicates the timing, strength and shape of the RF pulses produced, and the timing and length of the data acquisition window. The pulse generator module 42 connects to a set of gradient amplifiers 46, to indicate the timing and shape of the gradient pulses that are produced during the scan. The pulse generator module 42 can also receive patient data from a physiological acquisition controller 48 that receives signals from a number of different sensors connected to the patient, such as ECG signals from electrodes attached to the patient. And finally, the pulse generator module 42 connects to a scan room interface circuit 50, which receives signals from various sensors associated with the condition of the patient and the magnet system. It is also through the scan room interface circuit 50 that a patient positioning system 52 receives commands to move the patient to the desired position for the scan.

The pulse generator module 42 operates the gradient amplifiers 46 to achieve desired timing and shape of the gradient pulses that are produced during the scan. The gradient waveforms produced by the pulse generator module 42 are applied to the gradient amplifier system 46 having Gx, Gy, and Gz amplifiers. Each gradient amplifier excites a corresponding physical gradient coil in a gradient coil assembly, generally designated 54, to produce the magnetic field gradients used for spatially encoding acquired signals. The gradient coil assembly 54 forms part of a magnet assembly 56, which also includes a polarizing magnet 58 (which in operation, provides a homogenous longitudinal magnetic field $B_0$ throughout a target volume 60 that is enclosed by the magnet assembly 56) and a whole-body (transmit and receive) RF coil 62 (which, in operation, provides a transverse magnetic field $B_1$ that is generally perpendicular to $B_0$ throughout the target volume 60). As will be appreciated, however, embodiments of the invention may utilize head coils and/or other localized RF coils.

The resulting MR signals emitted by the excited nuclei in the patient may be sensed by the same RF coil 62 and coupled through the transmit/receive switch 64 to a preamplifier 66. The amplifier MR signals are demodulated, filtered, and digitized in the receiver section of a transceiver 68. The transmit/receive switch 64 is controlled by a signal from the pulse generator module 42 to electrically connect an RF amplifier 70 to the RF coil 62 during the transmit mode and to connect the preamplifier 66 to the RF coil 62 during the receive mode. The transmit/receive switch 64 can also enable a separate RF coil (for example, a surface coil) to be used in either transmit or receive mode.

The MR signals picked up by the RF coil 62 are digitized by the transceiver module 68 and transferred to a memory module 72 in the system control 32. A scan is complete when an array of raw k-space has been acquired in the memory module 72. This raw k-space data/datum is rearranged into separate k-space data arrays for each image to be reconstructed, and each of these is input to an array processor 76 which operates to Fourier transform the data into an array of image data, i.e., "images space." This image data is conveyed through the serial link 34 to the computer system 22 where it is stored in memory 30. In response to commands received from the operator console 12, this image data may be archived in long-term storage or it may be further processed by the image processor 26 and conveyed to the operator console 12 and presented on the display 18.

Figure 2:
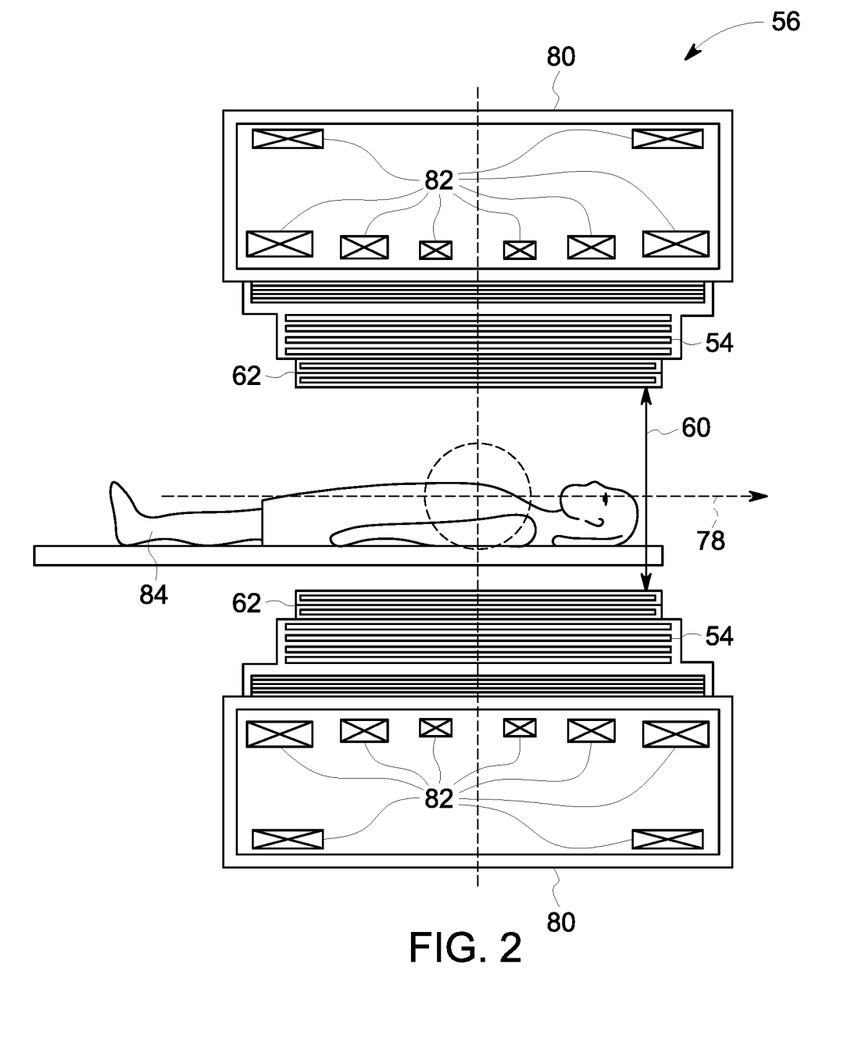
FIG. 2 is a schematic cross-sectional view of a magnet assembly of the MRI system of FIG. 1, in accordance with an embodiment of the present invention.

As illustrated in FIG. 2, a schematic side elevation view of the magnet assembly 56 is shown in accordance with an embodiment of the invention. The magnet assembly 56 is cylindrical in shape having a center axis 78. The magnet assembly 56 includes a cryostat 80 and one or more radially aligned longitudinally spaced apart superconductive coils 82 that form the polarizing magnet 58. The superconductive coils 82 are capable of carrying large electrical currents and are designed to create the $B_0$ field within the patient/target volume 60. As will be appreciated, the magnet assembly 56 may further include both a terminal shield and a vacuum vessel (not shown) surrounding the cryostat 80 in order to help insulate the cryostat 80 from heat generated by the rest of the MRI system 10 (FIG. 1). The magnet assembly 56 may still further include other elements such as covers, supports, suspension members, end caps, brackets, etc. (not shown). While the embodiment of the magnet assembly 56 shown in FIGS. 1 and 2 utilizes a cylindrical topology, it should be understood that topologies other than cylindrical may be used. For example, a flat geometry in a split-open MRI system may also utilize embodiments of the invention described below. As further shown in FIG. 2, a patient/object/imaged subject 84 is inserted into the magnet assembly 56.

Figure 3:
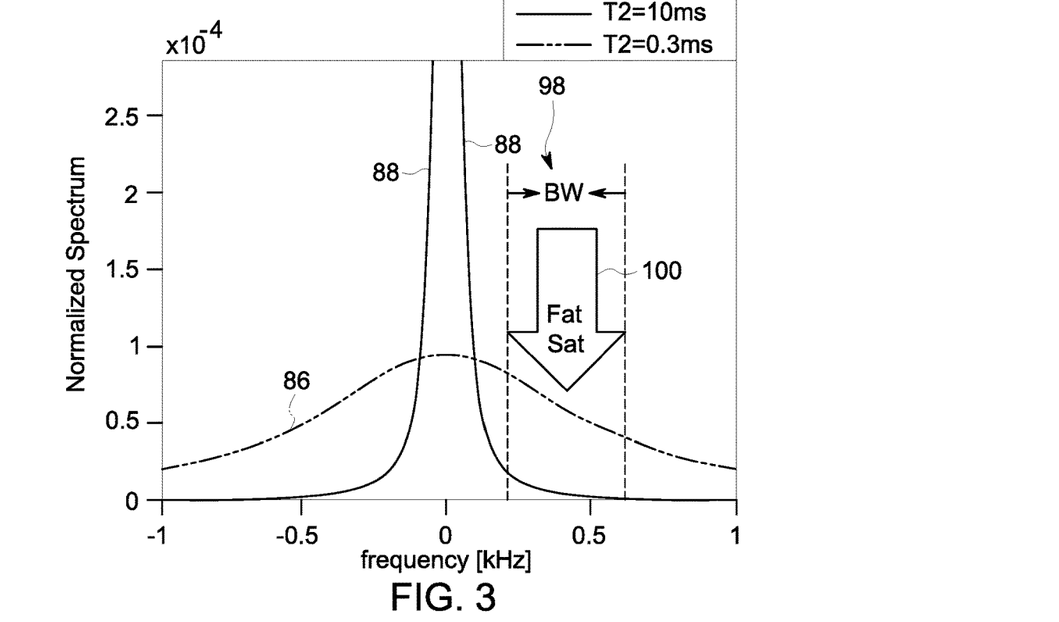
FIG. 3 is a diagram of a Lorenzian spectrum of T2 MR signals acquired from the object by the MRI system of FIG. 1, and of a FS signal transmitted into the object by the MRI system, in accordance with an embodiment of the present invention.
Figure 4:
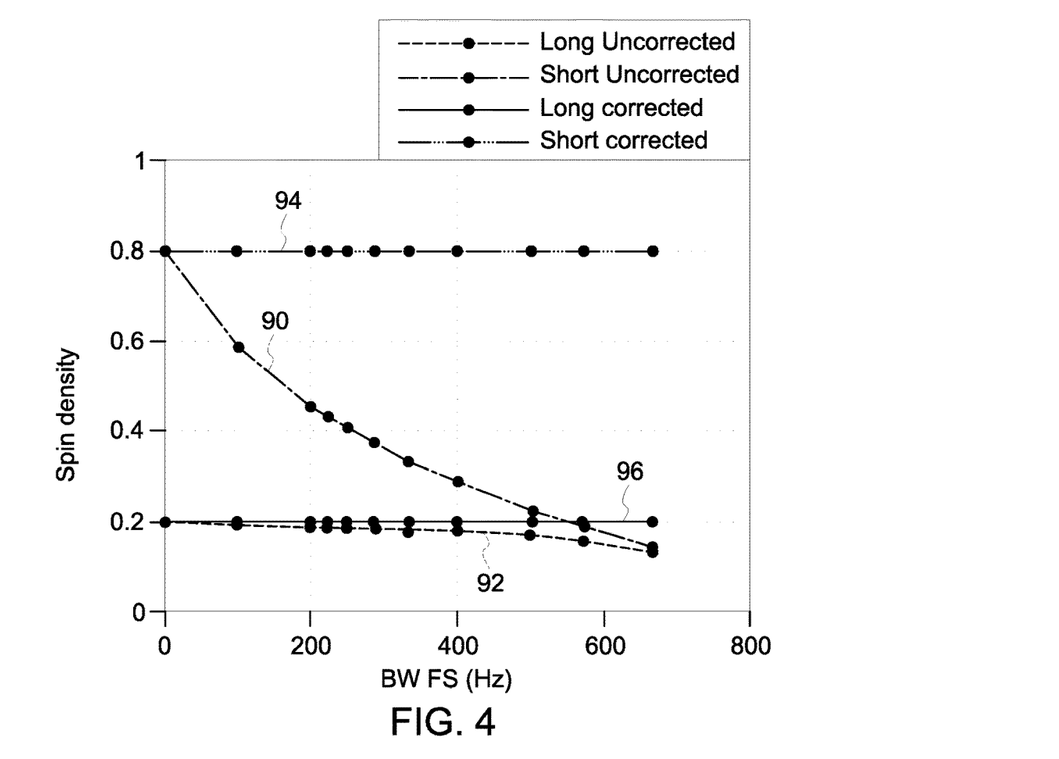
FIG. 4 is a diagram depicting the correction of spin densities generated from the MR signals of FIG. 3 by the MRI system of FIG. 1, in accordance with an embodiment of the present invention.

Turning to FIGS. 3 and 4, in embodiments, the MRI system 10 acquires MR signals 86, 88 (FIG. 3) from the object 84 via the magnet assembly 56, and generates correct T2 values along with incorrect spin densities 90, 92 (FIG. 4) by applying a fitting model to the MR signals 86, 88 via the MRI controller 36. The MRI controller 36 generates one or more correction/reduction factors Q, and then subsequently generates corrected spin densities 94, 96 (FIG. 4). As will be appreciated, and explained in greater detail below, the correction factors Q are based at least in part on the correct T2 values and the bandwidth 98 (FIG. 3) of an FS signal/pulse 100 applied to the object 84 via the magnet assembly 56. Further, the MRI system 10 may acquire the MR signals 86, 88 in accordance with an UTE acquisition sequence.

As will be understood, for a given T2* component, application of the FS signal 100 causes a reduction in the available MR signal level 86, 88 of the effected tissue. As the FS signal 100 effects all subsequent echoes of a tissues equally, the FS signal 100 has little effect on the overall decay curve of the tissues. As will be appreciated, however, MSK tissues of interest within the object 84 may contain structures with multiple short T2 components, i.e., tissues having T2 species with short transverse relaxation times, that simultaneously contribute to the total MR signal emitted by the object 84. Such T2 species may in turn be attenuated by the FS signal 100 to varying amounts, which in turn correspond to the reduction factors Q.

Figure 5:
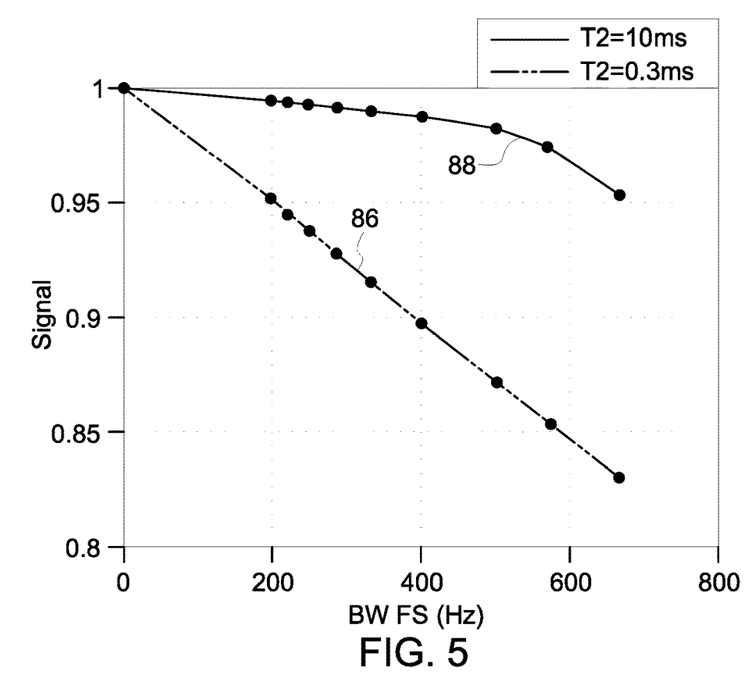
FIG. 5 is a diagram depicting reduction of the T2 MR signals in relation to a bandwidth of the FS signal of FIG. 3.

For example, as shown in FIG. 3, shorter T2 species/tissues 86, which typically have broader linewidths than longer T2 species 88, tend to be attenuated more by the FS signal 100 than the longer T2 species 88. For example, while FIG. 5 shows that the attenuation effects of the FS signal 100 become more pronounced on both long and short T2 species 86, 88 as the bandwidth 98 of the FS signal 100 increases, shorter T2 species 86 become attenuated at a greater rate than longer T2 species 88.

Thus, the combined MR signal from two (2) T2 species within the object 84 can be expressed by the following bi-component fitting model:

$$S_{Tot}(TE) = Q(T_2^1)\rho_1 e^{-\frac{TE}{T_2^1}} + Q(T_2^2)\rho_2 e^{-\frac{TE}{T_2^2}}$$

where TE is a series of MR echoes, $S_{Tot}(TE)$ is the total combined acquired MR signal, Q is a reduction factor, $\rho_1$ and $\rho_2$ are the corrected spin densities 94, 96 for the two (2) T2 species, respectively, and $$e^{-\frac{TE}{T_2^1}} \text{ and } e^{-\frac{TE}{T_2^2}}$$

are the decay rates for the two (2) T2 species, respectively. As a simplifying example, assume that the object 84 contains equal spin populations, e.g., $\rho_1=\rho_2$. Thus, the above model becomes:

$$S_{Tot}(TE) = Q(T_2^1)e^{-\frac{TE}{T_2^1}} + Q(T_2^2)e^{-\frac{TE}{T_2^2}}$$

By further assuming that $T_2^1=10$ ms, $T_2^2=0.3$ ms, and that the bandwidth 98 is 400 Hz, the model then becomes:

$$S_{Tot}^{FS}(TE) = 0.98 e^{-\frac{TE}{T_2^1}} + 0.9 e^{-\frac{TE}{T_2^2}}$$

When the FS signal 100 is not applied, the model further becomes:

$$S_{Tot}^{NFS}(TE) = e^{-\frac{TE}{T_2^1}} + e^{-\frac{TE}{T_2^2}}$$

Figure 6:
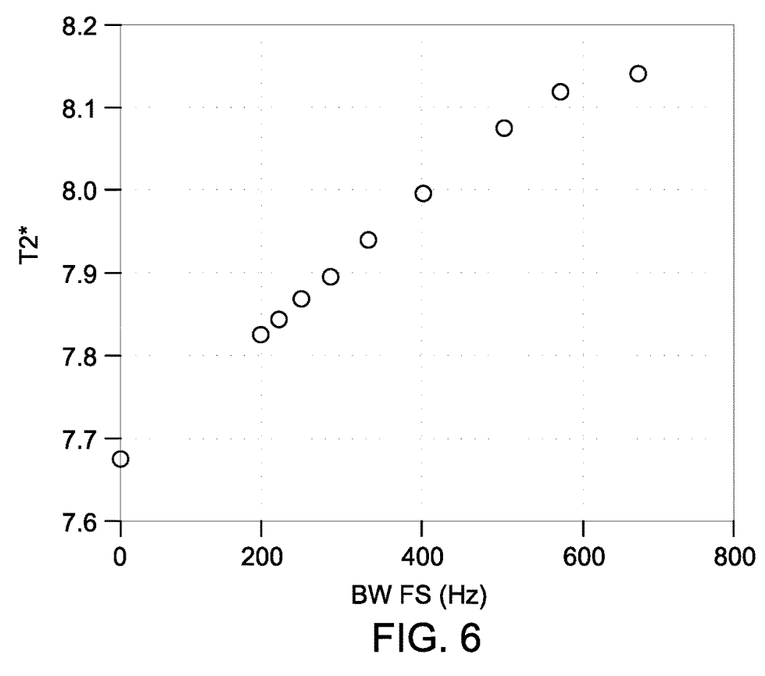
FIG. 6 is a diagram of a single component fitting model of the MRI system of FIG. 1, in accordance with an embodiment of the present invention.

Thus, as can be seen, the FS signal 100 weights the total combined MR signal more towards longer T2 species, and therefore, results in a higher fitter value for T2. As will be appreciated, FIG. 6 depicts the systemic effects on a single component T2 fitting which results in overall T2 values lying between two components. Thus, for higher bandwidths 98, the shorter T2 components are attenuated more and the overall measured T2 therefore increases. As will be appreciated, the correction factors Q may be based at least in part on a priori knowledge, e.g., pre-recorded data regarding the effects of the FS signal 100 on one or more T2 species.

Thus, embodiments of the invention may generate the correct T2 values and the incorrect spin densities 90, 92 of two or more tissues within the object 84 by applying a fitting model, which may be a bi-component fitting model similar to the one described above, to the acquired MR signals without consideration of the FS signal 100. In other word, the fitting model may be configured such that it provides/generates spin densities that would be correct in the absence of the FS signal 100. Accordingly, such embodiments may then obtain the corrected spin densities 94, 96 by dividing the incorrect spin densities 90, 92 by the correction factors Q.

After having obtained/generated the corrected spin densities 94, 96, embodiments of the invention may then generate one or more pool fractions based at least in part on the corrected spin densities 94, 96.

Finally, it is also to be understood that the system 10 may include the necessary electronics, software, memory, storage, databases, firmware, logic/state machines, microprocessors, communication links, displays or other visual or audio user interfaces, printing devices, and any other input/output interfaces to perform the functions described herein and/or to achieve the results described herein. For example, as previously mentioned, the system may include at least one processor and system memory/data storage structures, which may include random access memory (RAM) and read-only memory (ROM). The at least one processor of the system 10 may include one or more conventional microprocessors and one or more supplementary co-processors such as math co-processors or the like. The data storage structures discussed herein may include an appropriate combination of magnetic, optical and/or semiconductor memory, and may include, for example, RAM, ROM, flash drive, an optical disc such as a compact disc and/or a hard disk or drive.

Additionally, a software application that adapts the controller to perform the methods disclosed herein may be read into a main memory of the at least one processor from a computer-readable medium. The term "computer-readable medium," as used herein, refers to any medium that provides or participates in providing instructions to the at least one processor of the system 10 (or any other processor of a device described herein) for execution. Such a medium may take many forms, including but not limited to, non-volatile media and volatile media. Non-volatile media include, for example, optical, magnetic, or opto-magnetic disks, such as memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, a RAM, a PROM, an EPROM or EEPROM (electronically erasable programmable read-only memory), a FLASH-EEPROM, any other memory chip or cartridge, or any other medium from which a computer can read.

While in embodiments, the execution of sequences of instructions in the software application causes at least one processor to perform the methods/processes described herein, hard-wired circuitry may be used in place of, or in combination with, software instructions for implementation of the methods/processes of the present invention. Therefore, embodiments of the present invention are not limited to any specific combination of hardware and/or software.

It is further to be understood that the above description is intended to be illustrative, and not restrictive. For example, the above-described embodiments (and/or aspects thereof) may be used in combination with each other. Additionally, many modifications may be made to adapt a particular situation or material to the teachings of the invention without departing from its scope.

For example, in an embodiment, a method for performing T2 magnetic resonance imaging of an object with fat suppression is provided. The method includes acquiring MR signals from the object via an MRI system, and generating correct T2 values and incorrect spin densities by applying a fitting model to the MR signals. The method further includes generating one or more correction factors, and generating corrected spin densities based at least in part on the incorrect spin densities and the one or more correction factors. The one or more correction factors are based at least in part on the correct T2 values and a bandwidth of a fat suppression signal applied to the object. In certain embodiments, the method further includes generating pool fractions based at least in part on the corrected spin densities. In certain embodiments, generating corrected spin densities based at least in part on the incorrect spin densities and the one or more correction factors includes dividing the incorrect spin densities by the one or more correction factors. In certain embodiments, acquiring MR signals from the object via an MRI system is performed using an ultrashort echo time acquisition sequence. In certain embodiments, the acquired MR signals are emitted by two or more T2 species within the object. In certain embodiments, the fitting model is a bi-component fitting model. In certain embodiments, the fitting model generates the correct spin densities in the absence of the applied fat suppression signal. In certain embodiments, the one or more correction factors are further based at least in part on pre-recorded data regarding the effects of the fat suppression signal on one or more T2 species within the object.

Other embodiments provide for an MRI system for performing T2 magnetic resonance imaging of an object with fat suppression. The MRI system includes an MRI controller in electronic communication with a magnet assembly. The MRI controller is operative to acquire MR signals from the object via the magnet assembly, and to generate correct T2 values and incorrect spin densities by applying a fitting model to the MR signals. The MRI controller is further operative to generate one or more correction factors, and to generate corrected spin densities based at least in part on the incorrect spin densities and the one or more correction factors. The one or more correction factors are based at least in part on the correct T2 values and a bandwidth of a fat suppression signal applied to the object by the magnet assembly. In certain embodiments, the MRI controller is further operative to generate pools fractions based at least in part on the corrected spin densities. In certain embodiments, the MRI controller generates the corrected spin densities based at least in part on dividing the incorrect spin densities by the one or more correction factors. In certain embodiments, the MRI controller acquires MR signals from the object based at least in part on an ultrashort echo time acquisition sequence. In certain embodiments, the acquired MR signals are emitted by two or more T2 species within the object. In certain embodiments, the fitting model is a bi-component fitting model. In certain embodiments, the fitting model generates the correct spin densities in the absence of the applied fat suppression signal. In certain embodiments, the one or more correction factors are further based at least in part on pre-recorded data regarding the effects of the fat suppression signal on one or more T2 species within the object.

Yet still other embodiments provide for a non-transitory computer readable medium storing instructions. The stored instructions are configured to adapt an MRI controller to acquire MR signals from an object via an MRI system, and to generate correct T2 values and incorrect spin densities via applying a fitting model to the MR signals. The stored instructions further adapt the MRI controller to generate one or more correction factors, and to generate corrected spin densities based at least in part on the incorrect spin densities and the one or more correction factors. The one or more correction factors are based at least in part on the correct T2 values and a bandwidth of a fat suppression signal applied to the object. In certain embodiments, the stored instructions further adapt the MRI controller to generate pool fractions based at least in part on the corrected spin densities. In certain embodiments, the stored instructions further adapt the MRI controller to generate the corrected spin densities based at least in part on dividing the incorrect spin densities by the one or more correction factors. In certain embodiments, the acquired MR signals are emitted by two or more T2 species within the object, and the fitting model is a bi-component fitting model.

Accordingly, by adjusting incorrect spin densities acquired during a T2 MRI of an object with the above described correction factors, some embodiments of the present invention may provide for the extraction of long and short T2 component fractions in the presence of a fat saturation signal. Accordingly, some embodiments of the present invention provide for improved MR signal reception for T2 MRIs, which in turn may provide for improved imaging capabilities over existing T2 MRI systems.

Additionally, while the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format are not intended to be interpreted as such, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description shown in the accompanying drawings shall be interpreted merely as examples illustrating the inventive concept herein and shall not be construed as limiting the invention.

What is claimed is:

1. A method for performing T2 magnetic resonance imaging of an object with fat suppression, the method comprising:
   acquiring MR signals from the object via an MRI system;
   generating correct T2 values and incorrect spin densities by applying a fitting model to the MR signals;
   generating one or more correction factors;
   generating corrected spin densities based at least in part on the incorrect spin densities and the one or more correction factors; and
   wherein the one or more correction factors are based at least in part on the correct T2 values and a bandwidth of a fat suppression signal applied to the object.

2. The method of claim 1 further comprising:
   generating pool fractions based at least in part on the corrected spin densities.

3. The method of claim 1, wherein generating corrected spin densities based at least in part on the incorrect spin densities and the one or more correction factors comprises:
   dividing the incorrect spin densities by the one or more correction factors.

4. The method of claim 1, wherein acquiring MR signals from the object via an MRI system is performed using an ultrashort echo time acquisition sequence.

5. The method of claim 1, wherein the acquired MR signals are emitted by two or more T2 species within the object.

6. The method of claim 5, wherein the fitting model is a bi-component fitting model.

7. The method of claim 1, wherein the fitting model generates the correct spin densities in the absence of the applied fat suppression signal.

8. The method of claim 1, wherein the one or more correction factors are further based at least in part on pre-recorded data regarding the effects of the fat suppression signal on one or more T2 species within the object.

9. An MRI system for performing T2 magnetic resonance imaging of an object with fat suppression, the MRI system comprising:
   an MRI controller in electronic communication with a magnet assembly and operative to:
   acquire MR signals from the object via the magnet assembly;
   generate correct T2 values and incorrect spin densities by applying a fitting model to the MR signals;
   generate one or more correction factors;
   generate corrected spin densities based at least in part on the incorrect spin densities and the one or more correction factors; and
   wherein the one or more correction factors are based at least in part on the correct T2 values and a bandwidth of a fat suppression signal applied to the object by the magnet assembly.

10. The MRI system of claim 9, wherein the MRI controller is further operative to:
    generate pool fractions based at least in part on the corrected spin densities.

11. The MRI system of claim 9, wherein the MRI controller generates the corrected spin densities based at least in part on dividing the incorrect spin densities by the one or more correction factors.

12. The MRI system of claim 9, wherein the MRI controller acquires MR signals from the object based at least in part on an ultrashort echo time acquisition sequence.

13. The MRI system of claim 9, wherein the acquired MR signals are emitted by two or more T2 species within the object.

14. The MRI system of claim 13, wherein the fitting model is a bi-component fitting model.

15. The MRI system of claim 9, wherein the fitting model generates the correct spin densities in the absence of the applied fat suppression signal.

16. The MRI system of claim 9, wherein the one or more correction factors are further based at least in part on pre-recorded data regarding the effects of the fat suppression signal on one or more T2 species within the object.

17. A non-transitory computer readable medium storing instructions configured to adapt an MRI controller to:
   acquire MR signals from an object via an MRI system;
   generate correct T2 values and incorrect spin densities via applying a fitting model to the MR signals;
   generate one or more correction factors;
   generate corrected spin densities based at least in part on the incorrect spin densities and the one or more correction factors; and
   wherein the one or more correction factors are based at least in part on the correct T2 values and a bandwidth of a fat suppression signal applied to the object.

18. The non-transitory computer readable medium of claim 17, wherein the stored instructions further adapt the MRI controller to:
   generate pool fractions based at least in part on the corrected spin densities.

19. The non-transitory computer readable medium of claim 17, wherein the stored instructions further adapt the MRI controller to:
   generate the corrected spin densities based at least in part on dividing the incorrect spin densities by the one or more correction factors.

20. The non-transitory computer readable medium of claim 17, wherein the acquired MR signals are emitted by two or more T2 species within the object, and the fitting model is a bi-component fitting model.

* * * * *